(12) United States Patent
Wortberg et al.

(10) Patent No.: US 10,272,856 B2
(45) Date of Patent: Apr. 30, 2019

(54) POWER DISTRIBUTOR WITH PLUG-IN ELECTRONICS

(71) Applicant: Lisa Draexlmaier GmbH, Vilsbiburg (DE)

(72) Inventors: Michael Wortberg, Dorfen (DE); Dorin Limbasan, Garching/Alz (DE); Uwe Marold, Bodenkirchen (DE); Martin Seidenschwand, Landshut (DE); Anton Bachmeier, Kumhausen (DE); Josef Wolfsecker, Geisenhausen (DE)

(73) Assignee: Lisa Draexlmaier GmbH, Vilsbiburg (DE)

( * ) Notice: Subject to any disclaimer, the term of this patent is extended or adjusted under 35 U.S.C. 154(b) by 0 days.

(21) Appl. No.: 15/922,117

(22) Filed: Mar. 15, 2018

(65) Prior Publication Data

US 2018/0201208 A1    Jul. 19, 2018

Related U.S. Application Data

(63) Continuation of application No. PCT/EP2016/072040, filed on Sep. 16, 2016.

(30) Foreign Application Priority Data

Sep. 16, 2015    (DE) .................. 10 2015 115 624

(51) Int. Cl.
| | |
|---|---|
| *H02B 1/04* | (2006.01) |
| *B60R 16/023* | (2006.01) |
| *B60R 16/03* | (2006.01) |
| *H01H 85/20* | (2006.01) |
| *H05K 5/00* | (2006.01) |
| *H01R 13/514* | (2006.01) |
| *H01R 9/24* | (2006.01) |

(Continued)

(52) U.S. Cl.
CPC ...... *B60R 16/0238* (2013.01); *B60R 16/0315* (2013.01); *H01H 85/2035* (2013.01);
(Continued)

(58) Field of Classification Search
CPC ..... H01R 9/926; H01R 9/2458; H01R 13/514
See application file for complete search history.

(56) References Cited

U.S. PATENT DOCUMENTS

| | | |
|---|---|---|
| 5,428,535 A | 6/1995 | Katsumata et al. |
| 5,581,130 A | 12/1996 | Boucheron |
| (Continued) | | |

FOREIGN PATENT DOCUMENTS

| | | |
|---|---|---|
| DE | 4422434 | 7/1995 |
| DE | 4429294 | 2/1996 |
| (Continued) | | |

OTHER PUBLICATIONS

International Search Report for International Application PCT/EP2016/072040, dated Dec. 7, 2016.

*Primary Examiner* — Tho D Ta

(74) *Attorney, Agent, or Firm* — Burris Law, PLLC

(57) ABSTRACT

The power distributor for vehicles according to the present disclosure includes at least the following components: an electronic attachment and a central distributor module with a printed circuit board for electrical components, a feed-in busbar to connect the printed circuit board to a feed-in terminal, and a cable directly connected to the power distributor. The electronic attachment accommodates the ESD-sensitive electronic components and serves to switch and where applicable to diagnose the electrical components on the printed circuit board and can be connected to the printed circuit board by a plug-in contact with several terminals. According to the present disclosure, the advantages of the printed circuit board for unbundling the signals to the various electrical components are combined with the advantages of a separate electronic attachment.

17 Claims, 6 Drawing Sheets

(51) Int. Cl.
  *H01R 9/22* (2006.01)
  *B60R 21/01* (2006.01)
  *H02G 3/08* (2006.01)

(52) U.S. Cl.
  CPC ........... *H02B 1/042* (2013.01); *H05K 5/0065* (2013.01); *B60R 2021/01006* (2013.01); *H01H 2085/208* (2013.01); *H01R 9/226* (2013.01); *H01R 9/2458* (2013.01); *H01R 13/514* (2013.01); *H02G 3/08* (2013.01)

(56) References Cited

U.S. PATENT DOCUMENTS

| | | | | |
|---|---|---|---|---|
| 7,549,872 | B2* | 6/2009 | Akahori | H01R 13/514 |
| | | | | 439/620.27 |
| 7,727,022 | B2* | 6/2010 | Polehonki | B60R 16/0238 |
| | | | | 439/620.27 |
| 8,961,198 | B2* | 2/2015 | Ferran Palau | H01R 4/58 |
| | | | | 439/620.27 |
| 2008/0038942 | A1 | 2/2008 | Gordon et al. | |
| 2018/0026381 | A1* | 1/2018 | Haraguchi | H02G 3/16 |
| | | | | 439/76.2 |

FOREIGN PATENT DOCUMENTS

| | | |
|---|---|---|
| DE | 19857623 A1 | 8/1999 |
| DE | 102009029166 | 3/2011 |
| DE | 102012214366 | 2/2014 |
| EP | 0135910 | 4/1985 |
| EP | 0965493 | 12/1999 |
| EP | 1201505 | 5/2002 |
| EP | 1950096 | 7/2008 |
| JP | H1041008 | 2/1998 |

\* cited by examiner

POWER DISTRIBUTOR WITH PLUG-IN ELECTRONICS

CROSS-REFERENCE TO RELATED APPLICATIONS

This application is a continuation of International Application No. PCT/EP2016/072040, filed on Sep. 16, 2016, which claims the benefit of DE 10 2015 115 624.5, filed on Sep. 16, 2015. The disclosures of the above applications are incorporated herein by reference.

FIELD

The present disclosure relates to a power distributor for a vehicle, which distributes power from a power source onto a plurality of electrical consumers.

BACKGROUND

The statements in this section merely provide background information related to the present disclosure and may not constitute prior art.

Power distributors in vehicles are responsible for guaranteeing the power supply to an ever-growing number of consumers in the vehicle. Consumers in this context may be a wide variety of control devices for functions such as airbags, window openers, lighting, entertainment systems and many more. In addition, the task of safeguarding the cables to the individual consumers generally also takes place in the power distributor.

The current is typically provided from the power source to the power distributor via one single feeder terminal. This is often referred to as a clamp 30. At the same time the power distributor has a plurality "n" of outlets to the given consumers.

Circuit board-based power distributors in particular are state-of-the-art. Here, the lines to the different consumers are unbundled through a printed circuit board. The electrical components for switching the current are installed on the circuit board. The switching elements are typically relays that are attached to the circuit board and switch the connection to one or more consumer(s). The consumers themselves are connected to the circuit board via cable sets, with each cable or several cables together being connected through a particular plug to the circuit board, which contains a mating connector. The installation of a circuit board-based power distributor solution of this nature is very complex, requiring the following activities:

the power distributor must be taken from a lattice box;
the power distributor must be mounted in the vehicle;
a plurality of plugs on the wiring side must be picked from the cable set and sorted; and finally
the plugs on the wiring side must be plugged one after the other onto the power distributor.

Production times are correspondingly long.

However, one advantage of such a solution is that control electronics such as a LIN interface are more easily integrated. The control of the relays can be sorted out on the printed circuit board. However, another disadvantage in addition to the long production times is that the base surface of the power distributor must be very large, as the plug receptacles must also be accommodated on the printed circuit board in addition to the fuses. Since the printed circuit board represents the largest cost factor, this solution is correspondingly expensive.

The problem with integrating electronic components into the printed circuit board of the power distributor as given in DE102012215366 A1 is that due to the ESD-sensitive electronic components (ESD stands for electrostatic discharge), the power distributor and where applicable the entire wiring harness has to be treated as ESD-sensitive and undergo costly and complex handling in manufacture, testing and transport.

Other approaches for a power distributor are known from DE 102009029166 A1. The power distributor has a modular design, i.e. a limited number of auxiliary modules are connectable to a central module, with fuses attached to both. In addition, the central module also accommodates the switching elements. However, in this case the accommodation of control electronics is critical, for this solution does not include a printed circuit board into which the control electronics could be integrated. Therefore, the control electronics must be connected to the switching elements of the power distributor via an internal cable set of the distributor.

A power distributor according to this variant has the disadvantage that the delivery of the electronics portion in the cable set is generally not accepted by the customer, since installing the cable set with the power distributor connected to it leads to a risk of damage due to improper handling, particularly with regard to electrostatic discharge (ESD).

SUMMARY

The present disclosure provides a power distributor that provides easy integration of control electronics at a reasonable cost. This is provided by the subject matters of the independent claims. Advantageous further developments of the present disclosure are found in the dependent claims, the description and the accompanying drawings.

A power distributor for vehicles in accordance with the present disclosure includes at least the following components: an electronic attachment with ESD-sensitive electronic components and a central distributor module having a printed circuit board for electrical components and a feed-in busbar to connect the printed circuit board to a feed-in terminal and to a cable directly connected to the power distributor. The electronic attachment is not located on the aforementioned printed circuit board, but rather it is connectable to the printed circuit board by a plug-in contact with several terminals.

In keeping with the present disclosure, the advantages of the printed circuit board for unbundling the signals to the various electrical components are combined with the advantages of a separate electronic attachment that is not connected to the cable or wiring harness from the start. The printed circuit board advantageously contains only electrical, but no electronic components, which are sensitive to ESD. Installing a power distributor of this type in the vehicle has special advantages for the installation, as given in the independent method claim. For example, production times are significantly reduced and less installation space is required in the vehicle. Compared to other circuit board-based distributors, the costs are much lower due to the smaller size of the printed circuit board. It is also possible to achieve a higher power density.

Accordingly, in an advantageous further development of the present disclosure, the central distributor module contains one or more contact chambers to accommodate and bond the directly connected cable. The distributor module is surrounded by a housing that contains the given contact chamber, into which the cable is inserted and which can be connected without the aid of a plug. Directly connected in the sense of the present disclosure means connecting a cable to a contact part without using a plug to do so. Crimp connections or MKS plugs are examples of this type of directly connected cable. Mechanically and electrically connecting the cable to the distributor module via the contact chamber can be advantageous, particularly if the cables are plugged on subsequently, after the placement of components on the central distributor module.

According to another improvement of the present disclosure, the feed-in busbar has fork contacts for connecting fuses that are connectable to individual cables. Fork contacts are well suited for easily and securely plugging in fuses. For one thing, fork contacts are suitable for attachment to a printed circuit board and they are scalable, i.e. when several fork contacts are lined up, the current capacity for the entire contact is multiplied accordingly. For another thing, in addition to fuses, a plurality of other contact blades or busbars may also be easily connected. Fork contacts are also easily produced on busbars by punching and bending, thus they are integrated into the busbars.

It is also advantageous to supplement the power distributor with one or more auxiliary modules. The auxiliary module here is directly connected to an electrical component on the printed circuit board or to the feed-in busbar. Additional switchable or not switchable fuses are attached to the auxiliary module. Depending on the size of the auxiliary module, the fuses connect a plurality of consumers and protect them accordingly through the fuses.

The number and size of the given auxiliary modules give rise in turn to a modular power distributor capable of being easily adapted to the requirements of the particular type or model of vehicle.

The aforementioned electrical components are advantageously relays used to switch consumers, particularly bistable relays, or contactors. Bistable relays have the advantage of consuming less power on the whole, as they can persist in both switching states without having an electric voltage applied. However, a false switching state may be taken up due to jolts or other mechanical effects, for which reason a bistable relay should be queried (diagnosed) about its switching state at short intervals to allow for corrections to be made if necessary. For this purpose, the output voltage of the relay is queried. However, this requires control and evaluation electronics, which according to the present disclosure are accommodated in the electronic attachment. The electronic attachment advantageously contains circuits for diagnosing the switching states of the electrical components, specifically the relays, but also of the current drawn by the consumers.

In addition, or as an alternative, the electronic attachment may also include a LIN controller. LIN (Local Interconnect Network) is the specification for a serial communications system capable of actuating a plurality of controllers through a single cable via controller-specific addresses. Accordingly, a LIN controller can draw signals earmarked for it from the cable and switch the consumers here in the power distributor in accordance with instructions which the LIN controller receives from a control device via the cable set. Microcontrollers and electronic components accommodated in the electronic attachment are suitable for use for this purpose. A control device to actuate the relays may be integrated in the electronic attachment itself or apart from it if the LIN controller is being used. The control device receives the diagnostic signals for the relays and, following a control algorithm, generates the switching signals that are passed on to the relays (where applicable via LIN bus and LIN controller).

Switching-state corrections, often within the range of 1 to 15 µs, are advantageously made directly through the circuits (control device) of the electronic attachment. This means that the diagnosis is made by frequent querying of the output voltage of the relay or relays and immediate evaluation and correction of the switching state on site in the electronic attachment itself, if only one malfunction due to jolting is at hand. Otherwise, the electronic attachment receives instructions from a central control device (such as a Body Control Unit) to switch the relays via the LIN controller. These switching-state modifications typically occur at larger intervals, meaning that the bandwidth of the LIN bus is sufficient.

Electronic components, on the other hand, are sensitive to electrostatic discharge. Therefore, in accordance with further improvements by the present disclosure, the electronic attachment is accommodated in a separate housing that covers and protects the electronic components contained therein. Additional protection of a mating contact in the electronic attachment may be provided by a surrounding insulated and raised side wall that is part of the housing. Furthermore, after the electronic attachment has been plugged onto the central distributor module, the electronic attachment may be latched and/or locked in place, i.e. it is protected from being dislodged from the central distributor module after suffering mechanical jolts such as those occurring in the vehicle. The latching is done via detent lugs on the housing of the distributor module, which interact with latch slots in the housing of the electronic attachment (or vice versa). The locking (secondary locking) is done through a sliding pin on the housing of the distributor module, which is inserted into a recess with a cavity in the housing of the electronic attachment. The locking device here is perpendicular to the direction of insertion of the electronic attachment. To facilitate removal of the electronic attachment, for example, a resilient tab acting against the direction of insertion of the electronic attachment may be affixed between the latches in the housing of the distributor module (see FIG. 7).

A method of the present disclosure for mounting a power distributor is performed in the following steps. First of all, the central distributor module containing the printed circuit board with the electronic components is readied. At least one cable, generally a plurality of cables, is directly connected to the central distributor module. Then, the central distributor module is mounted in the vehicle together with the wiring harness. Afterwards, the electronic attachment is provided and plugged onto a plug-in contact of the central distributor module. Finally, the electronic attachment is latched and/or locked to the central distributor module.

By unbundling electrical and electronic components, for one thing the electronic components in the electronic attachment may be handled taking ESD into account, and at the same time, the other elements of the power distributor, namely the central distributor module and where applicable auxiliary modules, can be installed in continuation of the usual assembly in the vehicle.

The above-described properties, features and advantages of the present disclosure, as well as the manner in which they are achieved, will become clearer and more easily understood in the following schematic description of one form, and they are explained below in greater detail with reference to the drawings. It should be understood that the description and specific examples are intended for purposes of illustration only and are not intended to limit the scope of the present disclosure.

BRIEF DESCRIPTION OF THE DRAWINGS

In order that the disclosure may be well understood, there will now be described various forms thereof, given by way of example, reference being made to the accompanying drawings, in which.

Figure 1:
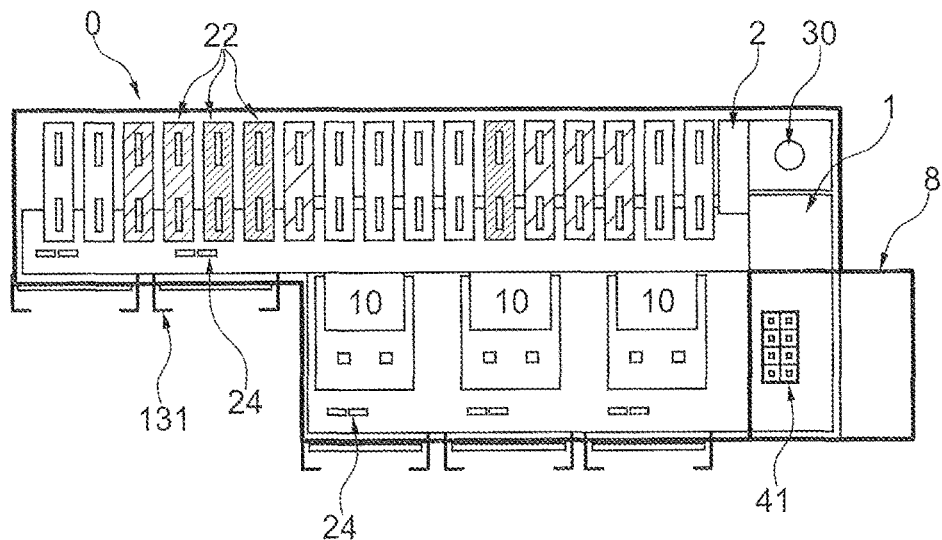
FIG. 1 shows a central distributor module with a printed circuit board and a feed-in busbar according to the present disclosure.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

FIG. 1 shows a central distributor module 0 with a printed circuit board 1 and a feed-in busbar 2. Electrical components 10, here bistable relays, are attached to the printed circuit board 1. In addition, freewheel resistors or freewheel diodes may be attached to support the discharging of the coils of the relays 10. The printed circuit board also contains a plug-in contact 41 serving as the plug-in point for the electronic attachment 3, as will be shown later.

The printed circuit board 1 is connected to a feed-in terminal 30 via the feed-in busbar 2. The feed-in busbar 2 is a stamped and bent part, preferably of copper or a copper alloy, that is connected to the printed circuit board 1 via solder points and contains a plurality of fork contacts into which fuses 22 (a total of 17 in FIG. 1) are plugged in and also fork contacts 24 for auxiliary modules. The central distributor module 0 is encased in a housing 8 that also contains fastening elements 131 for auxiliary modules not shown here, so that these auxiliary modules can be connected both mechanically and electrically to the central distributor module 0. The housing 8 is typically made by injection molding and serves to mechanically accommodate the printed circuit board 1, feed-in busbar 2 and all electrical components 10 situated thereupon, and also fuses 22.

Figure 2:
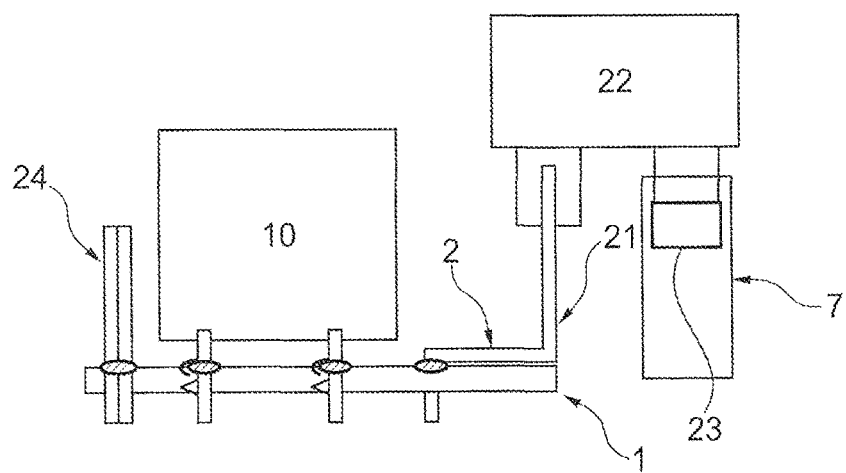
FIG. 2 shows the connection of electrical components, fork contacts and fuses to the printed circuit board according to the present disclosure.

The connection of the components can be seen more clearly in FIG. 2. The electrical components (a bistable relay) 10 are soldered onto the printed circuit board 1. In addition, the feed-in busbar 2 is connected to the printed circuit board 1 via a soldered contact. The feed-in busbar 2 is bent at an angle, forming a fork contact 21 that is oriented toward the fuse 22. The fuse 22 may be inserted into the fork contact. Another contact terminal of the fuse 22 is plugged into a contact chamber 7 of the housing of the central distributer module. A cable 23 can be directly connected to this second terminal of the fuse 22, for example through an MKS contact.

FIG. 2 also shows a fork contact 24 that is likewise soldered onto the printed circuit board. The fork contact 24 consists of two juxtaposed individual contacts that thus have twice the current carrying capacity. As will be shown further below, this fork contact 24 serves to make the electrical connection of an auxiliary module. The different solder points are interconnected on the printed circuit board 1 via printed conductors, the result of which is a circuit diagram for switching the different relays 10 in accordance with the requirements of the electronic attachment 3 to be explained further below.

Figure 3:
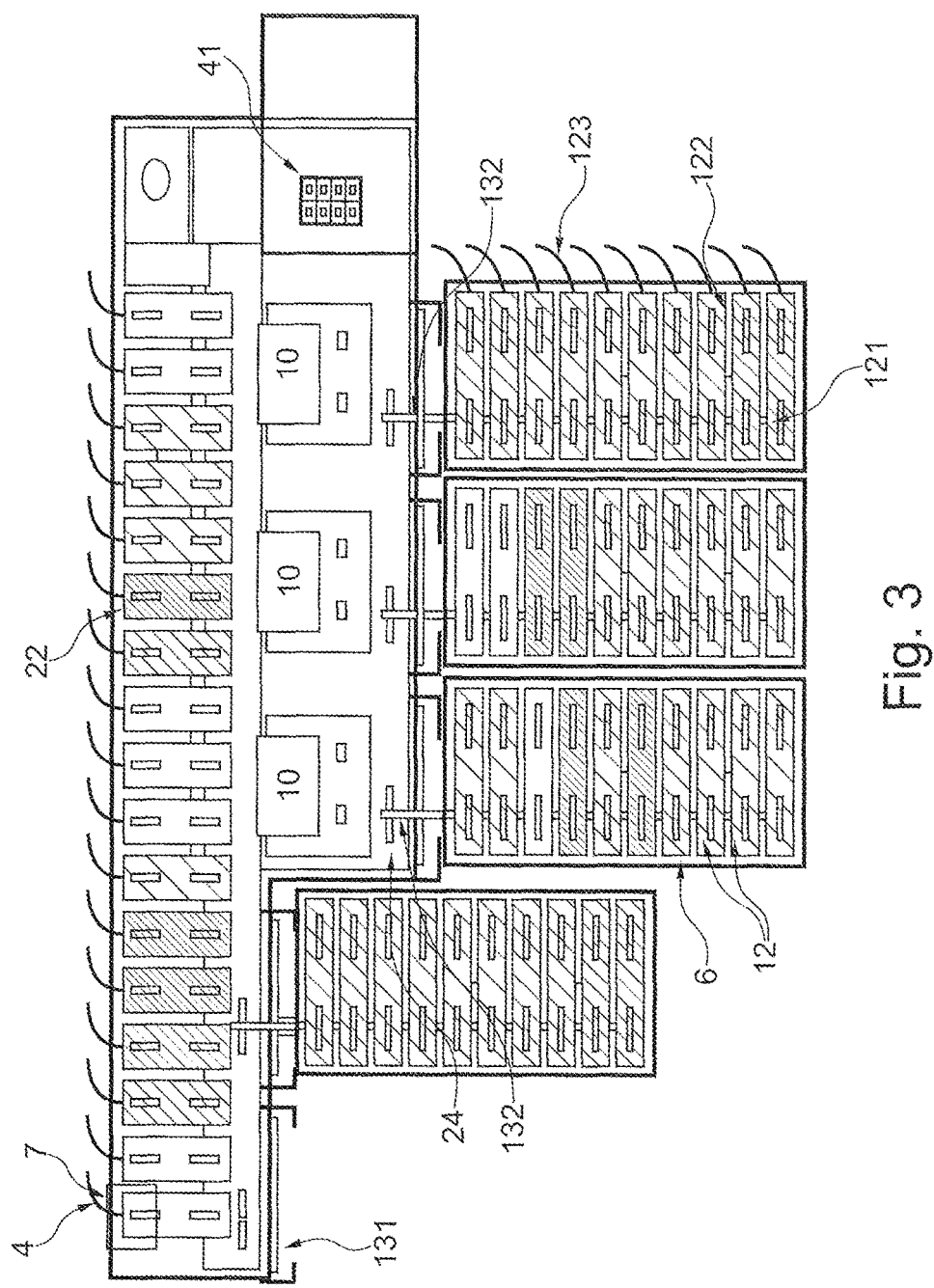
FIG. 3 shows a central distributor module with four auxiliary modules shown as examples according to the present disclosure.

In FIG. 3 the power distributor explained above has been supplemented with four auxiliary modules 6. These auxiliary modules 6 are either directly connected to the feed-in busbar 2 or to the relay 10, i.e. some auxiliary modules 6 are switchable while others are not. The auxiliary modules 6 contain a plurality of fuses 12, and in FIG. 3, there are ten fuses 12 in each module, shown as an example. However, a different number may also be selected. Furthermore, these auxiliary modules 6 do not always all contain the same number of fuses 12. Depending on the requirement of the consumer, the fuses 12 may have different actuating characteristics. The auxiliary modules 6 are connected to the feed-in busbar 2 or to the printed circuit board 1 through electrical contacts 132 of the auxiliary module 6, which are connectable to fork contacts 24 on the printed circuit board 1 or the feed-in busbar 2.

FIG. 3 also shows the direct connection of the fuses 12, 22 to the wiring harness, i.e. to a plurality of cables 4, 123. The fuses 12 are connected by one contact 121 to the relay 10 (for the switchable auxiliary modules 6) or directly to the feed-in busbar 2. With the other contact 122 there is a connection to a respective directly connected cable 123. Through the plug-in contact 41, the electronic attachment 3 is supplied with power, the output voltages of the relays 10 are made available as diagnostic signals, and control signals of the electronic attachment 3 are passed on to the relays 10.

Figure 4:
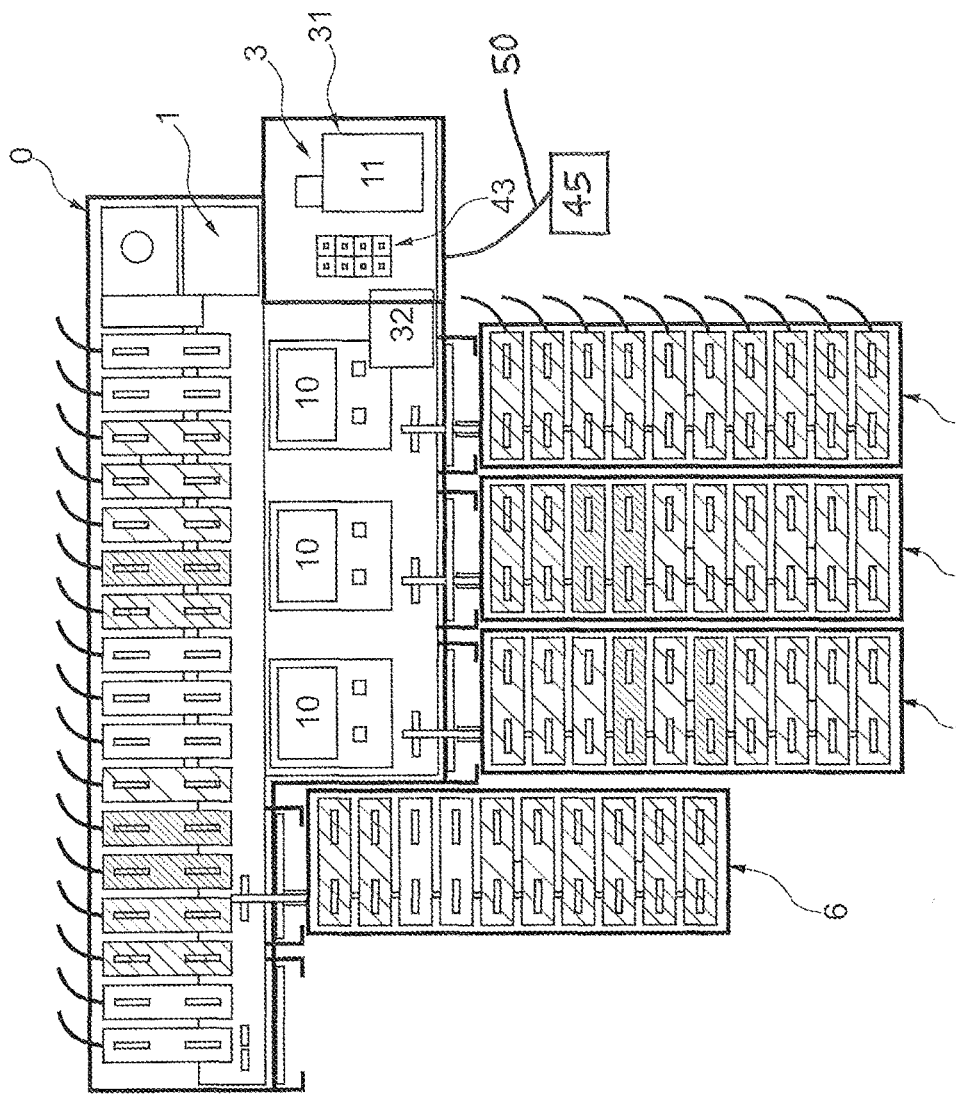
FIG. 4 shows a central distributor module with auxiliary modules and a plugged-on electronic attachment according to the present disclosure.

FIG. 4 now shows the power distributor after an electronic attachment 3 has been plugged onto the contact 41 of the central distributor module 0. For this, the electronic attachment 3 contains a mating contact 43 that interacts with the plug-in contact 41. The electronic attachment 3 contains electronic components 11 to diagnose the switching states of the electrical components 10 of the printed circuit board 1, and electronic components 11 to control the electrical components 10. Furthermore, FIG. 4 shows that the electronic attachment 3 can be locked to the central distributor module 0 through a locking mechanism 32. FIGS. 6 and 7 again illustrate this lock and a latch.

The mating contact 43 in FIG. 4 additionally establishes a connection to a control device 45 via a cable set 50 (with at least one wire). In the event of changes in the switching state for individual consumers, the control device 45 uses a switching algorithm to generate the control signals for actuating the electrical components 10, and the signals are passed on through the electronic attachment 3. In the event that a relay is inadvertently jolted into a faulty switching state, corrections in the switching state are made directly by the electronic components 11 of the electronic attachment 3 after evaluation of the diagnostic signals (output voltage of the relay 10).

Figure 5:
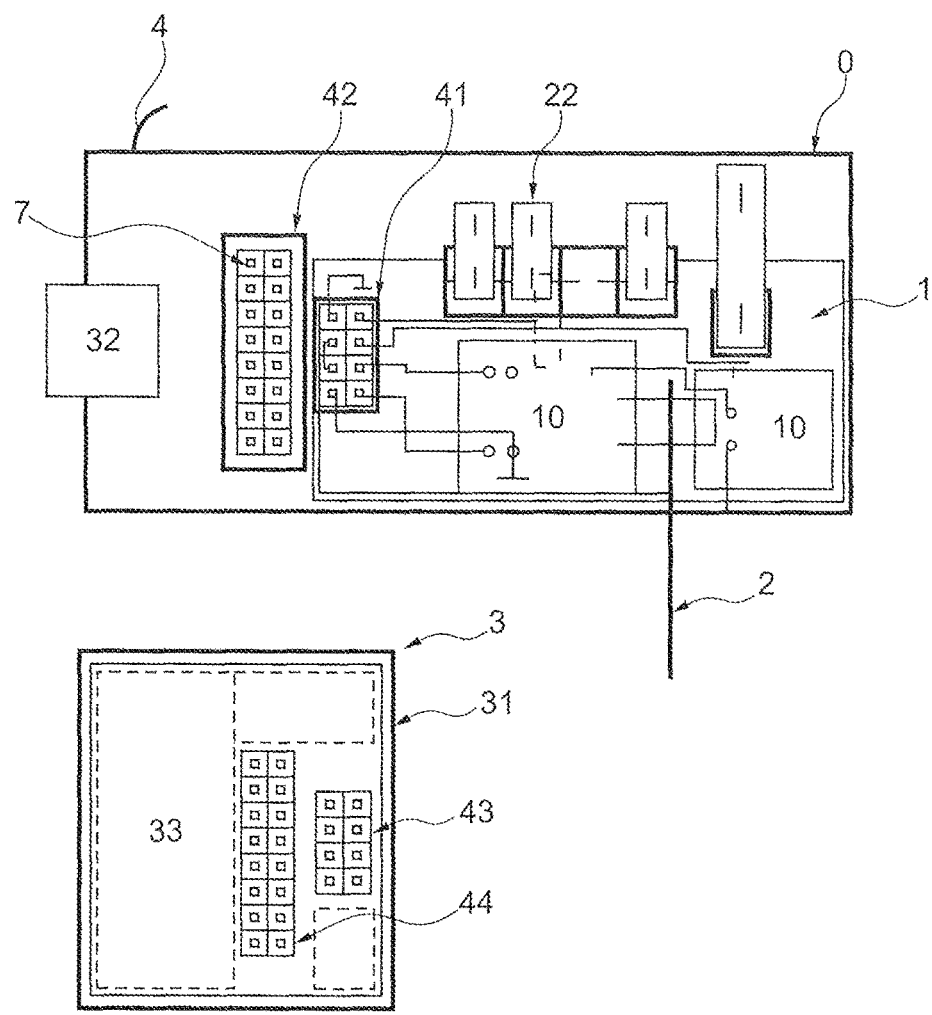
FIG. 5 shows another form of the power distributor, with a central distributor module and auxiliary plug-in contact for the wiring harness according to the present disclosure.

An alternative form of the present disclosure is shown in FIG. 5, in which a printed circuit board 1 is again the main focus of attention. The electrical components 10, again relays, are mounted on the printed circuit board, and are connected by the printed circuit board 1 via printed conductors to a plug-in contact 41 for the electronic attachment 3 and also to a plug-in contact 42 for the cable set. The cables 4 of the cable set are directly connected to the plug-in contact 42 for the cable set. The power for the printed circuit board 1 is supplied through a feed-in busbar 2, in this case a blade contact, which establishes the connection to a feed-in terminal not shown here. Unlike the previous example, the cables 4 are not connected to the printed circuit board 1 through fuses, but rather via the plug-in contact 42.

In addition, a locking mechanism 32 is suggested here as well, which interacts with the electronic attachment 3 shown in the lower part of FIG. 5. If this electronic attachment 3 is plugged onto the central distributor module 0 by two mating contacts 43, 44 for the electronic attachment and the cable set, then the electronic attachment 3 continues to be used not only to diagnose the electrical components 10 on the printed circuit board, but it is also used as a LIN controller that receives its signals directly from the cable set through a cable 4 and the mating plug 44. For this purpose, the electronic attachment 3 contains a plurality of electronic components 33. The electronic attachment 3 is encased in a housing 31 that interacts with the central distributor module 0 when locked via the locking mechanism 32.

As illustrated here, the directly connected compact distributor system with plug-on electronics shows that the plug-on electronics are capable of assuming control tasks not only for the printed circuit board, but also outside of this power distributor. This power distributor may also assume control tasks for other elements of the cable set through the plug-in contact for the cable set 42, if in addition to the cables supplying power for the consumers or in addition to the LIN cables other control cables are also connected to the plug-in contact for the cable set.

Figure 6:
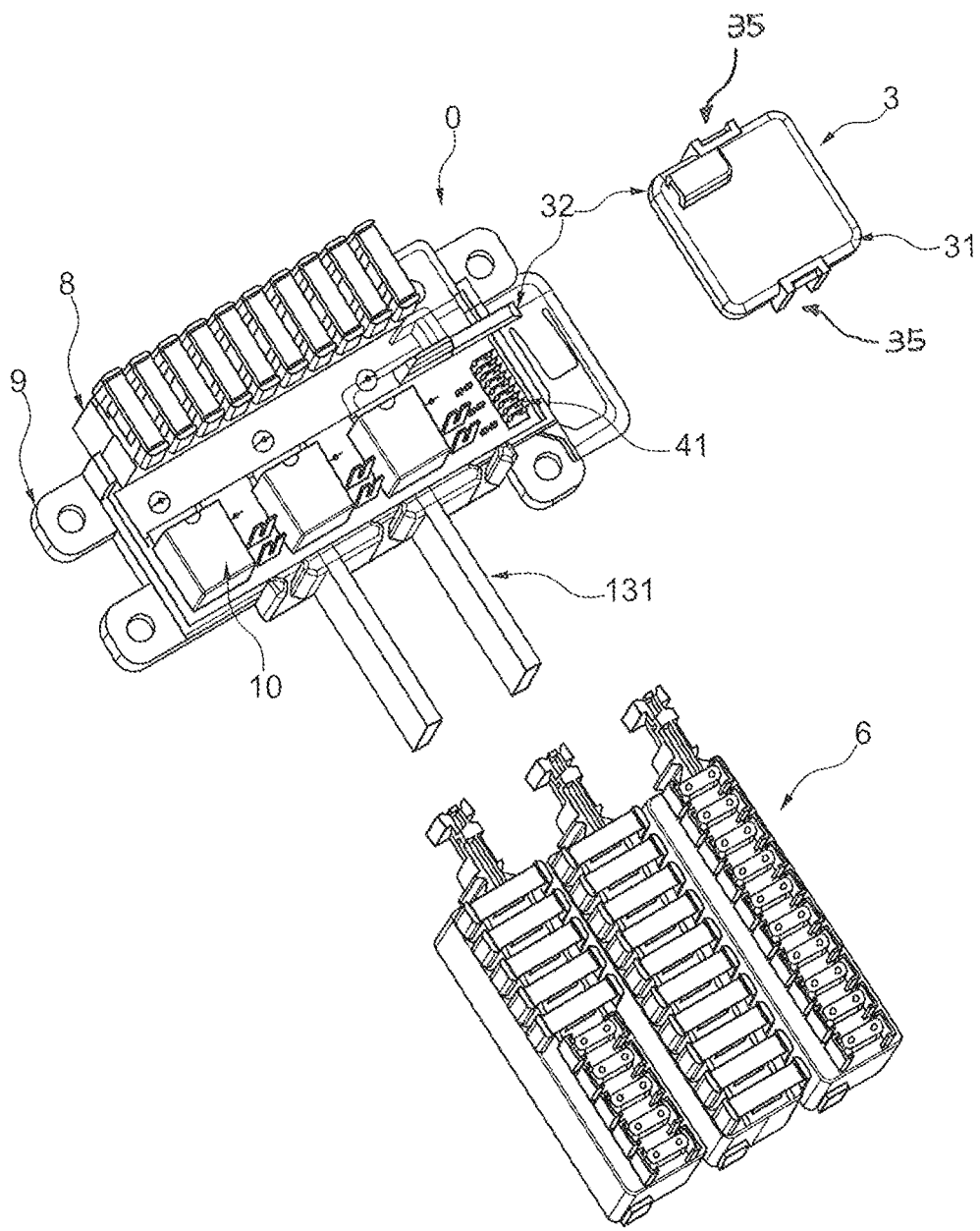
FIG. 6 is a perspective view of the central power distributor before the auxiliary modules and the electronic attachment have been mounted or plugged on according to the present disclosure.

FIG. 6 shows that the central distributor module 0 is encased in a housing 8 of injection-molded material, having an attachment element 9 for one thing, to secure the power distributor to the vehicle, and for another thing having a locking mechanism 32 that locks the separate electronic attachment 3 in place after it has been inserted and secured by the latch 35 to the central distributor module 0. The electrical components 10 are also covered by the housing 8 so as to eliminate risk of undesired electrical contacts.

Attachment elements 131 for the auxiliary modules 6 project from the central distributor module 0. As a result, when these auxiliary modules 6 are plugged on, not only is a stable mechanical attachment created. As shown above, sufficient electrical contact of the fuses attached to the auxiliary modules 6 and of consumers connected to the fuses is also established via fork contacts.

The electronic attachment 3 is encased in an insulating housing 31 of injection-molded material. To protect the mating contact 43, which is hidden in FIG. 6, from being inadvertently touched, the mating contact 43 is surrounded in the electronic attachment 3 by a peripheral insulating side wall that is part of a housing 31. This peripheral side wall is greater in height than contact pins of the mating contact 43.

Figure 7:
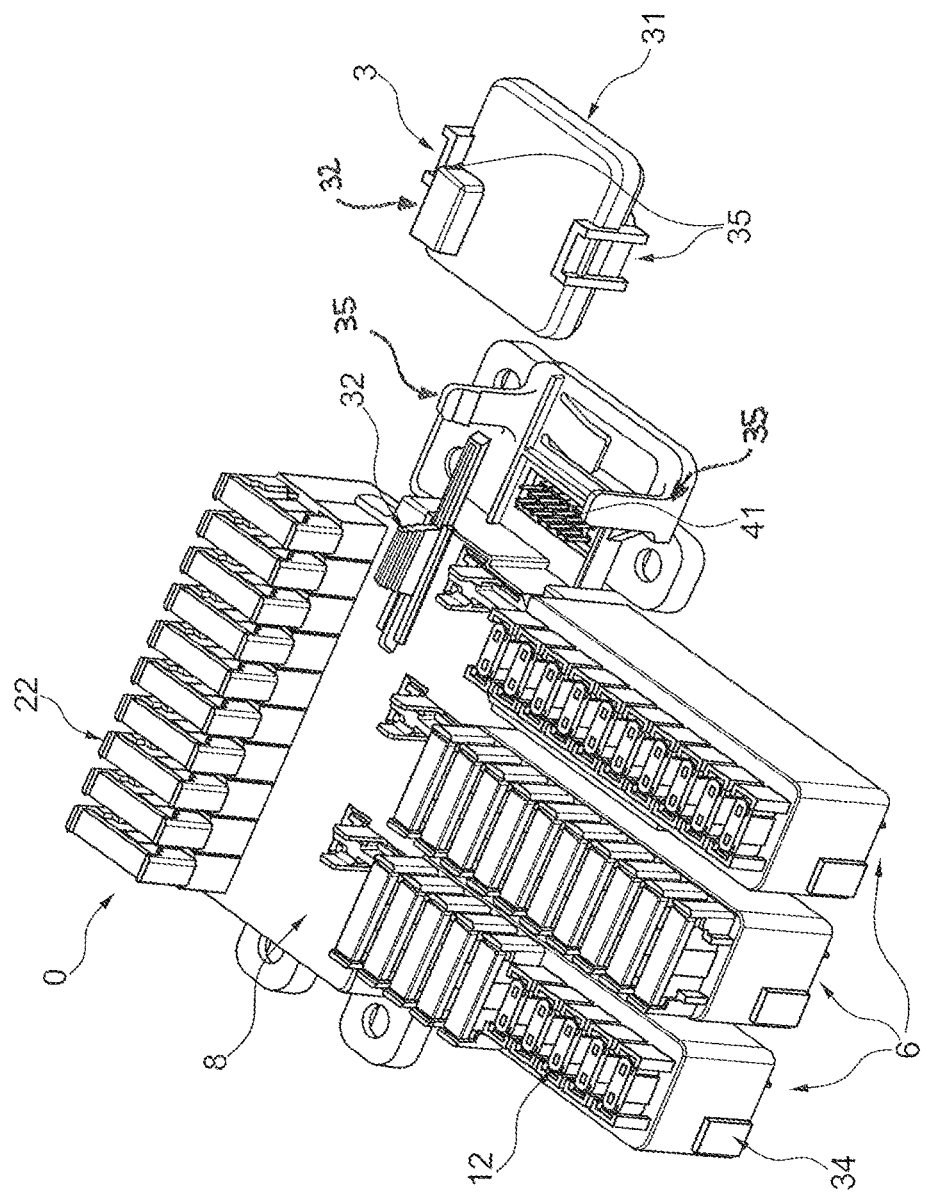
FIG. 7 is a perspective view of the central power distributor after the auxiliary modules and the electronic attachment have been mounted or plugged on according to the present disclosure.

In FIG. 7, the auxiliary modules 6 are already connected to the central distributor module 0. Here the fuses 12, 22 situated both on the central distributor module 0 and on the auxiliary modules 6 are more clearly visible. The auxiliary modules 6 also contain locking mechanisms 34 interacting with the attachment element 131 (from FIG. 6) of the particular auxiliary module 6, to inhibit unintentional detachment of the auxiliary module 6 from the central distributor module 0. The lock 32 for the electronic attachment 3 comprises a pin mounted in the casing 8 of the central distributor module 0 and projecting into the housing 31 of the electronic attachment 3 upon deployment. The lock 32 acts as a secondary lock after the electronic attachment 3 has been plugged onto the distributor module 0. Before this takes place, when the electronic attachment 3 is plugged on it can be latched to two tabs of the housing 8 of the central distributor module 0, thereby forming a latch 35 together with two matching parts on the housing 31 of the electronic attachment 3. At the same time, the electrical connection is established with the plug 41. The two latches 35 are arranged at opposite ends on the housing 31, so that during operation of the power distributor there are as few vibrations as possible and thus no corrosion forming on the electrical contact between the plug-in contact 41 for the electronic attachment 3 and the mating contact 43 for the electronic attachment 3, as well as between the plug-in contact 42 for the cable set 50 and the mating contact 44 for the cable set 50. As an alternative to the separate plug-in contacts 41, 42, a single plug-in contact 41 for both functionalities may also be used.

The locking to the central distributor module 0 takes place on completion of this plug-in action.

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. A power distributor for a vehicle, comprising:
    a central distributor module comprising:
        a printed circuit board,
        a plurality of electrical components attached to the printed circuit board, wherein at least one of the electrical components is a bistable relay,
        a plug-in contact having a plurality of terminals;
        at least one directly connected cable connected to a power supply;
        a feed-in terminal connected to the at least one directly connected cable, and
        a feed-in busbar that connects the printed circuit board to the feed-in terminal; and
    an electronic attachment comprising
        a mating contact having a plurality of terminals, and
        at least one ESD-sensitive electronic component for diagnosing and switching the electrical components,
    wherein the electronic attachment is connected to the printed circuit board by the terminals of the plug-in contact and the terminals of the mating contact.

2. The power distributor according to claim 1, wherein the central distributor module has at least one contact chamber to accommodate and connect the directly connected cable.

3. The power distributor according to claim 1, wherein the feed-in busbar has fork contacts to connect fuses configured to be connected to individual cables.

4. The power distributor according to claim 1, wherein printed circuit board has printed conductors for electrical components between the electrical components and the plug-in contact to the electronic attachment.

5. The power distributor according to claim 1, wherein the mating contact is surrounded in the electronic attachment by a peripheral insulating side wall that is part of a housing of the electronic attachment.

6. The power distributor according to claim 1, wherein the plug-in contact has terminals for supplying power to the electronic attachment.

7. The power distributor according to claim 1, wherein the plug-in contact has terminals for actuating at least one electrical component.

8. The power distributor according to claim 1, wherein the plug-in contact has terminals for connection to a LIN bus in a cable set.

9. The power distributor according to claim 1 further comprising at least one auxiliary module provided to protect additional consumers and connected to an electrical component on the printed circuit board or to the feed-in busbar.

10. The power distributor according to claim 9, wherein the auxiliary module has several fuses, each being connected by one contact to the electrical component or to the feed-in busbar, and by the other contact directly to an individual cable.

11. The power distributor according to claim 1 further comprising a separate housing provided for the electronic attachment and covering the electronic components installed in the electronic attachment.

12. The power distributor according to claim 11 further comprising a latch for affixing the electronic attachment to the central distributor module upon being plugged on, and a locking mechanism to lock the electronic attachment to the central distributor module after the electronic attachment has been plugged on.

13. The power distributor according to claim 1, wherein the electronic attachment generates control signals for the electrical components on the basis of diagnostic signals of the electrical components, to correct a switching state.

14. The power distributor according to claim 13, wherein the switching state is changed within a range of 1 to 15 µs.

15. The power distributor according to claim 1, wherein the electronic attachment includes a LIN controller connected to a control device to change a switching state of the electrical components.

16. The power distributor according to claim 15, wherein the LIN controller is connected to the control device via a cable set.

17. A method for assembling a power distributor comprising:
   providing a central distributor module having a printed circuit board for electrical components, and a plug-in contact having a plurality of terminals, wherein at least one of the electrical components is a bistable relay;
   directly connecting the printed circuit board to at least one cable connected to a power supply;
   installing the central distributor module in a vehicle;
   providing an electronic attachment having ESD-sensitive electronic components, and a mating contact having a plurality of terminals;
   connecting the electronic attachment to the central distributor module by the plurality of terminals of the mating contact and the plurality of terminals of the plug-in contact; and
   locking the electronic attachment to the central distributor module with a latch and/or a locking mechanism.

* * * * *